(12) United States Patent
Yang et al.

(10) Patent No.: US 7,786,505 B1
(45) Date of Patent: Aug. 31, 2010

(54) REDUCTION OF CHARGE LEAKAGE FROM A THYRISTOR-BASED MEMORY CELL

(75) Inventors: Kevin J. Yang, Santa Clara, CA (US); Hyun-Jin Cho, Palo Alto, CA (US)

(73) Assignee: T-RAM Semiconductor, Inc., Milpitas, CA (US)

( * ) Notice: Subject to any disclaimer, the term of this patent is extended or adjusted under 35 U.S.C. 154(b) by 317 days.

(21) Appl. No.: 11/303,237

(22) Filed: Dec. 16, 2005

(51) Int. Cl.
*H01L 29/74* (2006.01)

(52) U.S. Cl. ............ 257/133; 257/392; 257/407; 257/107; 257/E21.389; 257/E21.703; 257/E27.112

(58) Field of Classification Search .......... 438/133, 438/257, 786; 257/107, 133, E21.389, E21.21, 257/E21.268, E21.293, E21.423
See application file for complete search history.

(56) References Cited

U.S. PATENT DOCUMENTS

| | | | |
|---|---|---|---|
| 6,462,359 B1 * | 10/2002 | Nemati et al. | ............ 257/107 |
| 6,583,452 B1 | 6/2003 | Cho et al. | |
| 6,611,452 B1 | 8/2003 | Han | |
| 6,653,174 B1 | 11/2003 | Cho et al. | |
| 6,653,175 B1 | 11/2003 | Nemati et al. | |
| 6,666,481 B1 | 12/2003 | Horch et al. | |
| 6,683,330 B1 | 1/2004 | Horch et al. | |
| 6,686,612 B1 | 2/2004 | Horch et al. | |
| 6,690,038 B1 | 2/2004 | Cho et al. | |
| 6,690,039 B1 | 2/2004 | Nemati et al. | |
| 6,703,646 B1 | 3/2004 | Nemati et al. | |
| 6,721,220 B2 | 4/2004 | Yoon et al. | |
| 6,727,528 B1 | 4/2004 | Robins et al. | |
| 6,734,815 B1 | 5/2004 | Abdollahi-Alibeik et al. | |
| 6,735,113 B2 | 5/2004 | Yoon et al. | |
| 6,756,612 B1 | 6/2004 | Nemati et al. | |
| 6,756,838 B1 | 6/2004 | Wu et al. | |
| 6,767,770 B1 * | 7/2004 | Horch et al. | ............ 438/133 |
| 6,777,271 B1 | 8/2004 | Robins et al. | |

(Continued)

OTHER PUBLICATIONS

Chau, R., Gate Dielectric Scaling for High-Performance CMOS: from SiO2 to High-K, Intel Corporation, Nov. 6, 2003. Available on the Internet at http://www.intel.com/pressroom/archive/backgmd/chau_high-k_metalgate_foils.pdf.

(Continued)

*Primary Examiner*—Zandra Smith
*Assistant Examiner*—Tsz K Chiu
(74) *Attorney, Agent, or Firm*—The Webostad Firm

(57) ABSTRACT

Formation of a thyristor-based memory cell is described. A first gate dielectric of the storage element is formed over a base region thereof located in a silicon layer. A transistor is coupled to the storage element via a cathode region located in the silicon layer. The transistor has a gate electrode formed over a second gate dielectric. A spacer is formed at least in part along a sidewall of the gate electrode facing a gate electrode of the storage element. A shallow implant region is formed in the silicon layer responsive at least in part to the spacer. The spacer offsets the shallow implant region from the sidewall. A portion of the shallow implant region is for an extension region. The first gate dielectric and the second gate dielectric are formed at least in part by deposition of a dielectric material.

10 Claims, 9 Drawing Sheets

U.S. PATENT DOCUMENTS

| | | |
|---|---|---|
| 6,778,435 B1 | 8/2004 | Han et al. |
| 6,781,888 B1 | 8/2004 | Horch et al. |
| 6,785,169 B1 | 8/2004 | Nemati et al. |
| 6,790,713 B1 | 9/2004 | Horch |
| 6,804,162 B1 | 10/2004 | Eldridge et al. |
| 6,815,734 B1 | 11/2004 | Horch et al. |
| 6,818,482 B1 | 11/2004 | Horch et al. |
| 6,819,278 B1 | 11/2004 | Abdollahi-Alibeik et al. |
| 6,828,176 B1 | 12/2004 | Nemati et al. |
| 6,828,202 B1 | 12/2004 | Horch |
| 6,835,997 B1 | 12/2004 | Horch et al. |
| 6,845,037 B1 | 1/2005 | Han |
| 6,872,602 B1 | 3/2005 | Nemati et al. |
| 6,885,581 B2 | 4/2005 | Nemati et al. |
| 6,888,176 B1 * | 5/2005 | Horch et al. .................. 257/107 |
| 6,888,177 B1 | 5/2005 | Nemati et al. |
| 6,891,205 B1 | 5/2005 | Cho et al. |
| 6,891,774 B1 | 5/2005 | Abdollahi-Alibeik et al. |
| 6,901,021 B1 | 5/2005 | Horch et al. |
| 6,903,987 B2 | 6/2005 | Yoon et al. |
| 6,911,680 B1 | 6/2005 | Horch et al. |
| 6,913,955 B1 | 7/2005 | Horch et al. |
| 6,937,085 B1 | 8/2005 | Samaddar |
| 6,940,772 B1 | 9/2005 | Horch et al. |
| 6,944,051 B1 | 9/2005 | Lee et al. |
| 6,947,349 B1 | 9/2005 | Abdollahi-Alibeik et al. |
| 6,953,953 B1 | 10/2005 | Horch |
| 6,955,965 B1 * | 10/2005 | Halliyal et al. .............. 438/257 |
| 6,958,931 B1 | 10/2005 | Yoon et al. |
| 6,965,129 B1 | 11/2005 | Horch et al. |
| 6,975,260 B1 | 12/2005 | Abdollahi-Alibeik et al. |
| 6,979,602 B1 | 12/2005 | Horch et al. |
| 6,980,457 B1 | 12/2005 | Horch et al. |
| 6,998,298 B1 | 2/2006 | Horch |
| 6,998,652 B1 | 2/2006 | Horch et al. |
| 7,006,398 B1 | 2/2006 | Yoon et al. |
| 7,381,999 B1 * | 6/2008 | Yang .......................... 257/133 |
| 2002/0004263 A1 * | 1/2002 | Tanabe et al. ................ 438/199 |

OTHER PUBLICATIONS

Chau, R. et al., Gate Dielectric Scaling for High-Performance CMOS: from SiO2 to High-K, Extended Abstracts of International Workshop on Gate Insulator 2003, pp. 124-126, Nov. 6-7, 2003.

Intel Corporation, Intel's High-k/Metal Gate Announcement. Nov. 4, 2003. Available on the Internet at ftp://download.intel.com/technology/silicon/HighK-MetalGate-PressFoils-final.pdf.

International Technology Roadmap for Semiconductors, 2003 Edition. "Front End Processes." pp. 22-33. Availiable on the Internet at http://public.itrs.net/Files/2003ITRS/FEP2003.pdf.

Matsumoto, T. et al., 70 nm SOI-CMOS of 135 GHz fmax with Dual Offset-Implanted Source-Drain Extension Structure for RF/Analog and Logic Applications, Technical Digest of the International Electron Devices Meeting 2001, pp. 10.3.1-10.3.4, 2001, IEEE.

Nemati, F. et al. Fully Planar 0.562um2 T-RAM Cell in a 130 nm SOI CMOS Logic Technology for High-Density High-Performance SRAMs, Technical Digest of the International Electron Devices Meeting 2004, pp. 273-276 Dec. 13-15, 2004, IEEE.

Yeo, Y.-C. et al., Direct Tunneling Gate Leakage Current in Transistors with Ultrathin Silicon Nitride Gate Dielectric, IEEE Electron Device Letters, vol. 21, No. 11, pp. 540-542, Nov. 2000.

Yeo, Y.-C., MOSFET Gate Leakage Modeling and Selection Guide for Alternative Gate Dielectrics Based on Leakage Considerations, IEEE Transactions on Electron Devices, vol. 50, No. 4, pp. 1027-1035, Apr. 2003.

* cited by examiner

REDUCTION OF CHARGE LEAKAGE FROM A THYRISTOR-BASED MEMORY CELL

FIELD OF THE INVENTION

One or more aspects of the invention generally relate to integrated circuits and, more particularly, to reduction of charge leakage from a thyristor-based memory cell.

BACKGROUND OF THE INVENTION

Conventionally, semiconductor memories such as static random access memory ("SRAM") and dynamic random access memory ("DRAM") are in widespread use. DRAM is very common due to its high density with a cell size typically between 6 $F^2$ and 8 $F^2$, where F is a minimum feature size. However, DRAM is relatively slow having an access time commonly near 20 nanoseconds ("ns"). SRAM access time is typically an order of magnitude faster than DRAM. Though, an SRAM cell is commonly made of four transistors and two resistors or of six transistors, thus leading to a cell size of approximately 60 $F^2$ to 100 $F^2$.

Others have introduced memory designs based on a negative differential resistance ("NDR") cell, such as a thyristor cell, to minimize the size of a conventional SRAM memory. A thyristor-based random access memory ("RAM") may be effective in memory applications. Additional details regarding a thyristor-based memory cell are described in U.S. Pat. Nos. 6,767,770 B1 and 6,690,039 B1.

A thyristor-based memory cell may be periodically pulsed to maintain state. Additional details regarding periodically pulsing a thyristor-based memory cell to restore state of such a cell may be found in Patent Cooperation Treaty ("PCT") International Publication WO 02/082504. Charge leakage out of a thyristor-based memory cell negatively impacts a restore rate of such cell. The more frequent the restore pulsing to maintain state, the more power that is consumed.

Accordingly, it would be desirable and useful to provide means to reduce charge leakage of a thyristor-based memory cell to allow for less frequent restoration pulsing.

SUMMARY OF THE INVENTION

One or more aspects of the invention generally relate to integrated circuits and, more particularly, to reduction of charge leakage from a thyristor-based memory cell.

An aspect of the invention is a thyristor-based memory cell. A thyristor-based storage element has a first gate electrode formed over a first gate dielectric. The first gate electrode has a first sidewall. The first gate dielectric is formed over a base region of the thyristor-based storage element. The base region is located in a silicon layer. A transistor is coupled to the thyristor-based storage element via a cathode region located in the silicon layer. The transistor has a second gate electrode formed over a second gate dielectric. The second gate electrode has a second sidewall. The second gate dielectric is formed over a body region of the transistor. The body region is located in the silicon layer. A spacer is formed at least in part along the second sidewall of the second gate electrode facing the first sidewall of the first gate electrode. A shallow implant region is formed in the silicon layer responsive at least in part to the spacer. The spacer offsets the shallow implant region from the second sidewall. A portion of the shallow implant region is for an extension region. The first gate dielectric and the second gate dielectric are formed at least in part by deposition of a dielectric material.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION OF THE DRAWINGS

In the following description, numerous specific details are set forth to provide a more thorough description of the specific embodiments of the invention. It should be apparent, however, to one skilled in the art, that the invention may be practiced without all the specific details given below. In other instances, well-known features have not been described in detail so as not to obscure the invention. For ease of illustration, the same number labels are used in different diagrams to refer to the same items; however, in alternative embodiments the items may be different.

Figure 1A:
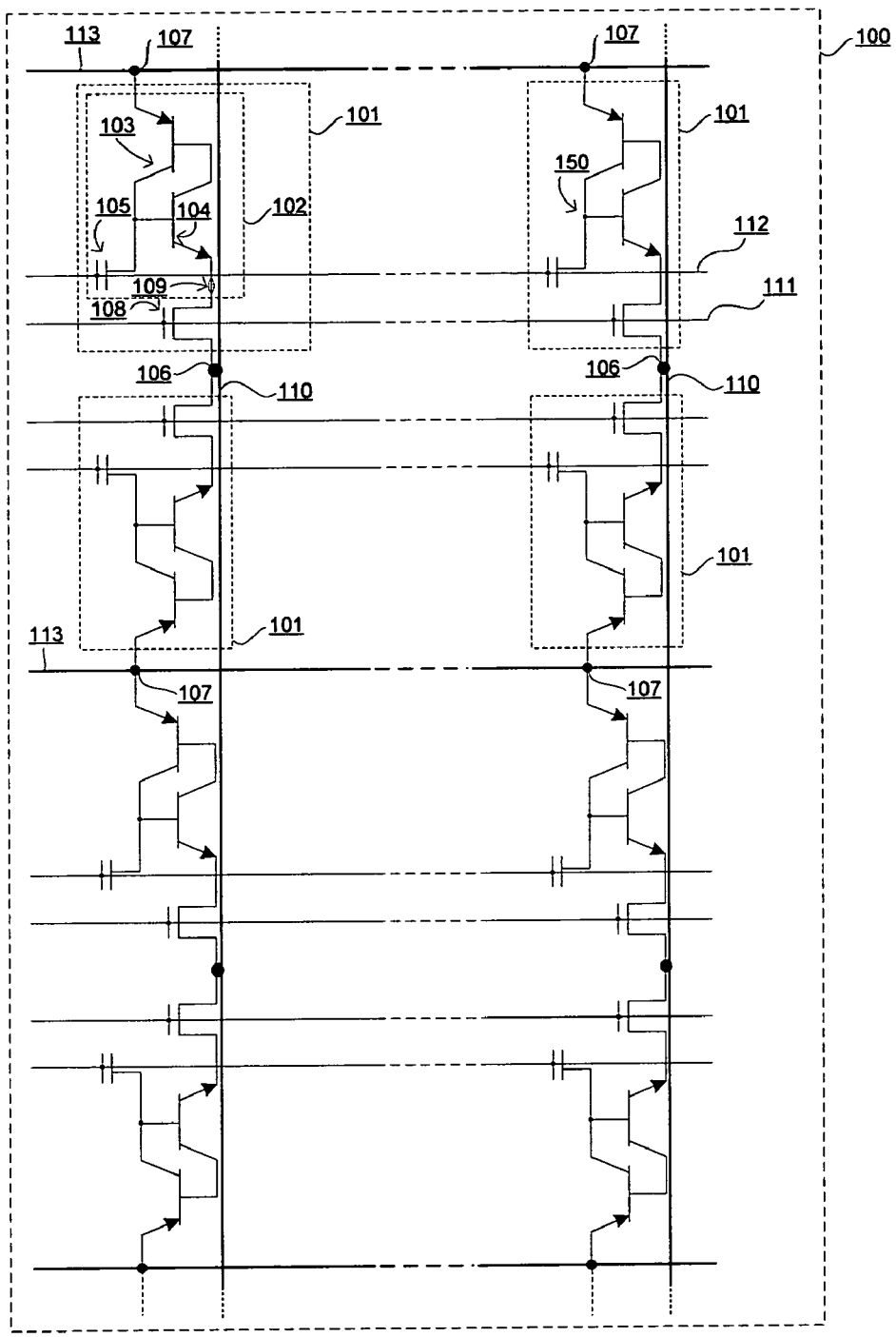
FIG. 1A is a schematic diagram depicting an exemplary embodiment of a memory array that includes thyristor-based memory cells.

FIG. 1A is a schematic diagram depicting an exemplary embodiment of a memory array 100. Memory array 100 includes thyristor-based memory cells 101. Pairs of memory cells 101 may be commonly coupled at a bitline contact 106 for connection to a bitline 110 and may be commonly coupled at a supply voltage contact 107 for connection to a supply voltage line 113. Notably, voltage on supply voltage line 113 is above both a logic low voltage reference level ("Vss") and a logic high voltage reference level ("Vdd"), and this supply voltage may be used as an anodic voltage for memory cell 101. Accordingly, reference to this supply voltage includes its anodic use, and as such it is referred to herein as "VDDA" to clearly distinguish it from Vdd. Thus, supply voltage line 113 is subsequently referred to herein as anode voltage line 113, and supply voltage contact 107 is subsequent referred to herein as anode contact 107.

Each memory cell 101 includes an access device ("transistor") 108, which may be a field effect transistor ("FET"), and a thyristor-based storage element 102. Notably, access device 108 need not be a transistor; however, for purposes of clarity by way of example access device 108 shall be referred to herein as transistor 108. Storage element 102 and transistor 108 may be commonly coupled at a node 109. Node 109 may be a cathodic node of storage element 102 and a source/drain node of transistor 108, and thus may be referred to hereafter as cathode node 109.

Illustratively shown in FIG. 1A is an equivalent circuit model of storage element 102 having cross-coupled bi-polar junction transistors ("BJTs") 103 and 104, as well as capacitor 105. Storage element 102 may be a type of a device known as Thin Capacity Coupled Thyristor ("TCCT") device. Again, in this example, storage element 102 is coupled in series with an NMOS transistor 108 to provide memory cell 101. However, a PMOS architecture may be used.

For each memory cell 101, a gate of access transistor 108 is formed from a wordline ("WL1") 111 in relation to an active area, as generally indicated in FIG. 1A by small dots coupling gates of access transistors 108 to WL1s 111. A control gate of storage element 102, generally indicated as a plate of capacitor 105, is formed with another wordline ("WL2") 112, as generally indicated by small dots coupling plates of capacitor 105 to WL2s 112. Though only a few rows of memory cells 101 are illustratively shown in FIG. 1A, it should be appreciated that many more rows may be used. The exact number of memory cells or bits associated with a WL1 111 or a WL2 112 may vary from application to application. However, for purposes of clarity by way of example and not limitation, it shall be assumed that there are 144 memory cells coupled to each WL1 111 and 18 memory cells coupled to each WL2 112, though other numbers for either or both may be used.

An emitter node of BJT 103 is coupled to anode voltage line 113 by anode contact 107. A base of BJT 103 is coupled to a collector of BJT 104. An emitter of BJT 104 is coupled to cathode node 109. A base of BJT 104 and a collector of BJT 103 are commonly coupled to a bottom plate of capacitor 105, and this common coupling location may be generally referred to as storage node 150.

Figure 1B:
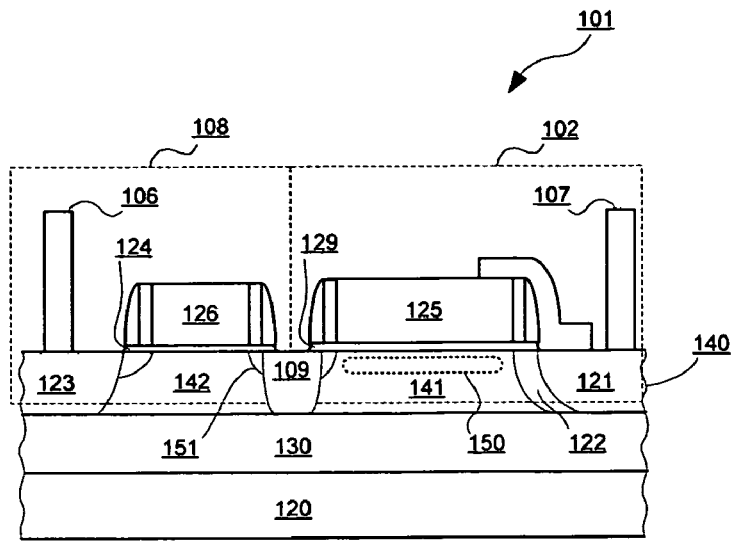
FIG. 1B is a cross-sectional view depicting an exemplary embodiment of a device structure for a thyristor-based memory cell of the memory array of FIG. 1A.

FIG. 1B is a cross-sectional view depicting an exemplary embodiment of a device structure for a memory cell 101 of FIG. 1A. In this embodiment, memory cell 101 is formed using a silicon-on-insulator ("SOI") wafer having a substrate layer 120 on which a buried oxide ("BOx") layer 130 is formed. Formed on BOx layer 130 is an active silicon layer 140. Though a portion of an SOI wafer is generally illustrated in FIG. 1B, other known types of semiconductor wafers may be used.

In active silicon layer 140, anode region 121, base region 122, base region 141, cathode region 109, and bitline access region 123 are formed. Base region 141 is located between base region 122 and cathode region 109 of storage element 102. Between cathode node 109 and access region 123 is access device body region 142. In an embodiment, regions 121, 141, and 142 may be p-type regions, and regions 109, 122, and 123 may be n-type regions. Above regions 141 and 142 may respectively be formed one or more dielectric layers 129 and 124. Above one or more dielectric layers 124 and 129 may respectively be formed wordlines 111 and 112 of FIG. 1A, which in association with regions 141 and 142 are defined gate electrodes 125 and 126, respectively. Notably one or more dielectric layers 124 and 129 may be the same or different sets of layers. For example, one or more dielectric layers ("gate dielectric") 124 as associated with gate electrode 126 may be thinner than one or more dielectric layers ("gate dielectric") 129 as associated with gate electrode 125. Gate electrode 126 is a gate of transistor 108 and an access gate of memory cell 101, and gate electrode 125 is a control gate of storage element 102 of memory cell 101. An anode contact 107 is coupled to anode region 121, and a bitline contact 106 is coupled to access region 123. Notably, access region 123 and cathode node 109 also serve as source/drain regions of transistor 108. Other details regarding memory cell 101, including silicides, extension regions, such as extension region 151 for example, and spacers, among other known details, may be found in U.S. Pat. Nos. 6,767,770 B1 and 6,690,039 B1.

Figure 2A:
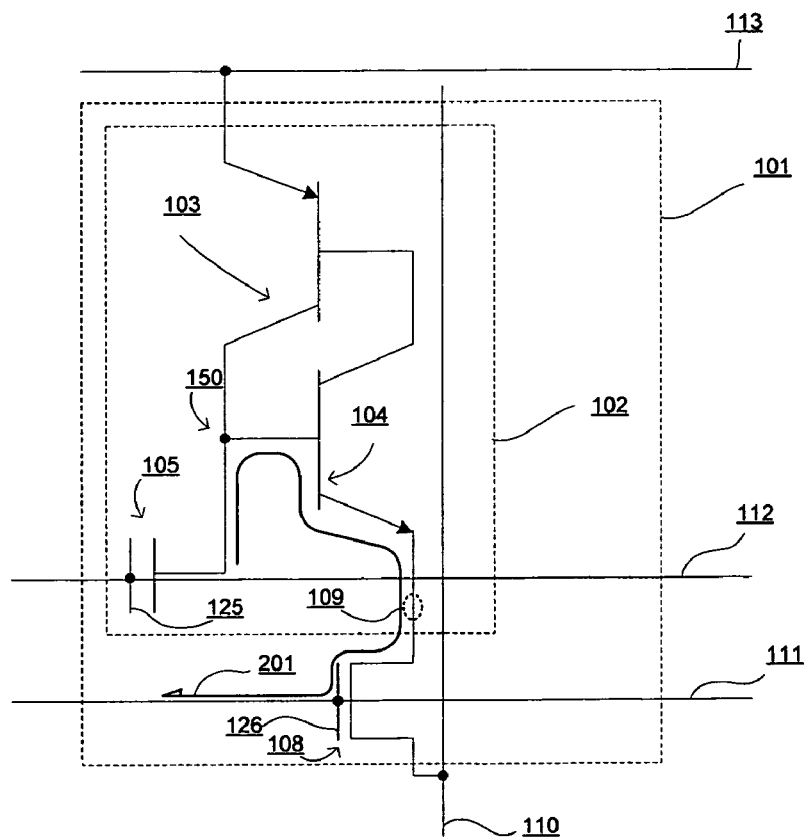
FIGS. 2A and 2B are enlarged versions of a portion of the schematic diagram of FIG. 1A depicting an exemplary embodiment of a thyristor-based memory cell, where charge leakage paths are illustratively shown.
Figure 2B:
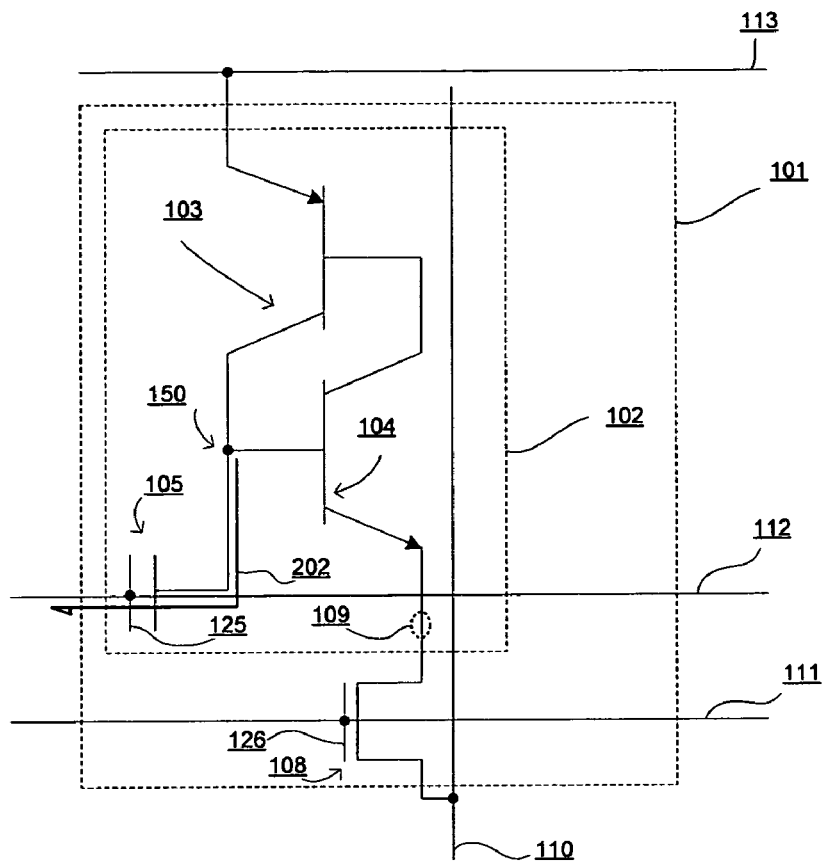

FIGS. 2A and 2B are enlarged versions of a portion of the schematic diagram of FIG. 1A depicting an exemplary embodiment of a thyristor-based memory cell 101, where respective charge leakage paths 201 and 202 are illustratively shown. With continued reference to FIGS. 2A and 2B, and renewed reference to FIG. 1B, charge leakage paths 201 and 202 are further described.

Charge retention, and thus data retention, of a thyristor-based memory cell 101 may be harmed by leakage of such charge stored in memory cell 101 through a gate dielectric, such as leakage through gate dielectric 124, gate dielectric 129, or a combination thereof. For example, charge stored in storage node 150 may leak from base to emitter of BJT 104, and thus to a source/drain 109 of transistor 108, and through gate dielectric 124 to gate electrode 126 of transistor 108, as generally indicated by charge leakage path 201. Such charge leakage, having arrived at WL1 111 is leaked out onto such wordline, thereby reducing stability of memory cell 101. Another possible charge leakage path is from storage node 150 through gate dielectric 129 to WL2 112, which is used to provide gate electrode 125 or an upper plate of capacitor 105. On reaching gate electrode 125, such charge may leak out onto WL2 112, as generally indicated by charge leakage path page 202, as illustratively shown in FIG. 2B.

Thus, for example, with respect to charge leakage path 201, charge in base region 141 may leak to cathode node 109 and into extension region 151 and then to and through gate dielectric 124 to gate electrode 126. Charge leakage path 202 is from base region 141 to and through gate dielectric 129 to gate electrode 125. Notably, base region 141 may be thought of as providing storage node 150 of memory cell 101.

Time-averaged standby current is approximately memory cell 101 read current, as limited by transistor 109 ("FET"), times the duty cycle during which the FET is on. Standby power associated with restoring memory cell 101 is proportional to frequency with which memory cell is restored. Such restore frequency of memory cell 101 depends at least in part on storage capacitance and bipolar gain of memory cell 101.

Thus, dynamic standby current for memory cell 101 depends at least in part on storage capacitance and internal amplification of such memory cell 101. Charge leakage path 201 removes charge from storage capacitance through gate dielectric 124. This charge leakage through gate dielectric 124 impacts the time interval which memory cell 101 can tolerate between restore operations and still be sufficiently stable to yield a proper data state when read. Reducing charge leakage via charge leakage path 201 facilitates less frequent restore operations while maintaining proper data state of memory cell 101 when read. A reduction in the frequency of such restore operations may result in a reduction in standby power consumption in accordance with the above-described relationship to dynamic standby current and storage capacitance.

The above effect of charge leakage path 201 is equally applicable to charge leakage path 202. Thus, reducing the amount of charge leakage via either or both of charge leakage paths 201 and 202 facilitates a longer time interval between restore pulsing of memory cell 101, as well as a reduction in standby power consumption.

There are three "solution spaces," described below, for increasing charge retention of memory cell 101 by reducing leakage current via reducing charge leakage. By "solution spaces," it is meant to generally indicate an approach to reducing charge leakage in a thyristor-based memory cell, and it is not meant to include any particular details as they may be varied as described below. One of these solution spaces may be used, or a combination of any two of these solutions spaces may be used, or a combination of all three of these solution spaces may be used.

One solution space is to make a gate dielectric less susceptible to charge tunneling by using a higher permittivity material to reduce charge leakage through either or both of charge leakage paths 201 and 202. By higher permittivity material, it is generally meant that dielectric constant, k, of the material is greater than 4.0. A second solution space is to reduce the effective area of a gate dielectric in which tunneling currents occur. A third solution space is to use a locally increased thickness in a region where tunneling current occurs across a gate dielectric. This local increase in thickness may be achieved using a "polysilicon reoxidation," as described below in additional detail. Again, it should be understood that any one, any combination of two, or all three of these solution spaces may be applied.

Figure 3:
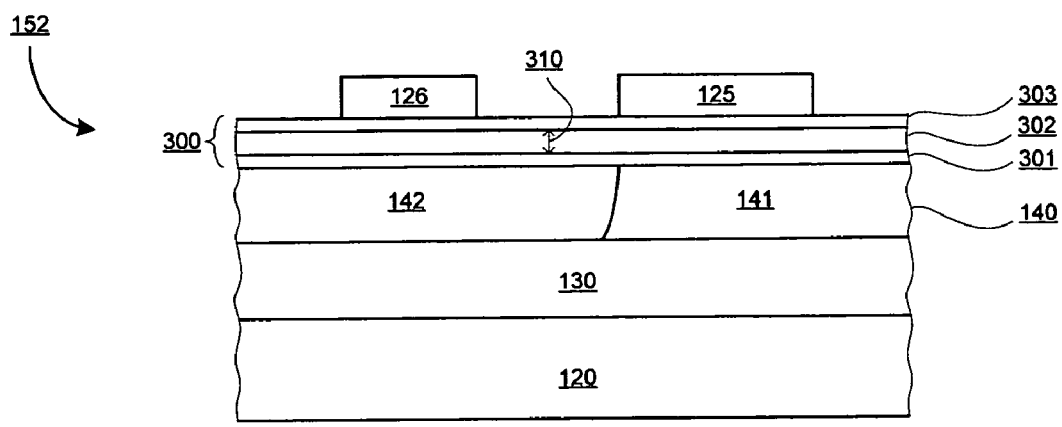
FIG. 3 is a cross-sectional view depicting an exemplary embodiment of a portion of a silicon-on-insulator wafer.

With respect to the first solution space, FIG. 3 is a cross-sectional view depicting an exemplary embodiment of a portion of an SOI wafer 152. Formed in silicon layer 140 are regions 141 and 142. Regions 141 and 142 may be formed in a known manner. An interfacial layer 301 is deposited on an exposed surface of silicon layer 140. Dielectric layer 302 is deposited immediately above an exposed upper surface of interfacial layer 301. Dielectric layer 302 is a "high k" dielectric layer having a dielectric constant greater than 4.0. Another interfacial layer 303 is deposited immediately above an exposed upper surface of dielectric layer 302. Notably, layers 301 through 303 in combination have a thickness 300. Notably, layers 301, 302, and 303 are actually much thinner than illustratively shown, and have been enlarged for reasons of visibility to the detriment of perspective.

Thickness 310 of dielectric layer 302, due to the high permittivity of such dielectric layer, may provide blocking of tunneling current. Electrons, and holes, quantum mechanically tunnel through layers, such as layers 301 through 303. Capacitance, which is conventionally surface area times the permittivity divided by the dielectric thickness, is a well known equation, and thus is not described herein in detail. Notably, for operation of a thyristor-based memory cell 101, such as of FIG. 1B, the relative surface area of capacitors formed at least in part with respect to gate electrodes 125 and 126 may be decreased, along with gate dielectric thickness, while increasing permittivity of the gate dielectric in order to obtain a target capacitance.

Accordingly, by using a high k dielectric, increased permittivity facilitates use of a thinner dielectric layer with the same capacitance per unit area. The thickness used depends on several factors, including device surface area and dielectric constant, to arrive at a target capacitance. Such target capacitance for a thyristor-based memory cell may be in a range of approximately 0.05 to 0.50 femtofarads, where thickness 310 in this embodiment is in a range of approximately 4 nm to 8 nm.

Whether interfacial layers 301 and 303 are used may be determined at least in part by the reactivity of dielectric layer 302 to either or both silicon layer 140 and gate electrode material, such as that used to form either or both gate electrodes 125 and 126. Thus, it should be appreciated that interfacial layers 301 or 303, or both, may be omitted depending on degree of tolerance of reactivity of dielectric layer 302 to other materials used. Examples of materials that may be used for dielectric layer 302 include a silicon oxynitride, silicon nitride, or an aluminum oxide (e.g., $Al_2O_3$). These examples of oxides have a dielectric constant k generally in a range of 4 to 10.

Other gate dielectrics, such as unary oxides or silicates, having a dielectric constant in a range of approximately 10 to 20 may be used. Examples of unary oxides include zirconium oxide (e.g., $ZrO_2$), hafnium oxide (e.g., $HfO_2$), yttrium oxide (e.g., $Y_2O_3$), lanthanum oxide (e.g., $La_2O_3$), gadolinium oxide (e.g., $Gd_2O_3$), and scandium oxide (e.g., $Sc_2O_3$). Examples of silicates that may be used include any of zirconium, hafnium, lanthanum, or yttrium oxides reacted with a silicon dioxide (e.g., $((Zr, Hf, La, Y)O_2)_y \cdot (SiO_2)_{1-y}$). For example, a hafnium silicate (e.g., $HfSi_xO_y$) may be used. Moreover, a nitrided silicate may be used, such as a nitrided hafnium silicate (e.g., $HfSi_xO_yN_z$) for example.

Higher k dielectrics, such as amorphous and single crystal materials, having a dielectric constant greater than approximately 20 may be used for a gate dielectric. Examples of such amorphous materials include lanthanum and yttrium aluminates, as well as rare earth aluminate alloys. Examples of single crystal materials that may be used include lanthanum aluminum oxide (e.g., $LaAl_3O_4$), barium zirconium oxide (e.g., $BaZrO_3$), yttrium oxide, and lanthanum oxide, as previously mentioned with respect to unary oxides.

Examples of materials that may be used for either or both of interfacial layers 301 and 303 include nitrogen-doped silicon oxide, silicon oxynitride, and aluminum oxide (e.g., $Al_2O_3$). Nitrogen-doped silicon oxide may have a less nitrogen content than silicon oxynitride. Silicon oxynitride may encompass known $SiO_xN_y$ stoichiometry values.

Known methods of deposition for forming layers 301, 302, and 303 include furnace deposition, rapid plasma enhanced chemical vapor deposition (RPECVD), rapid thermal chemical vapor deposition (RTCVD), jet vapor deposition (JVD), molecular beam epitaxy (MBE), metal organic chemical vapor deposition (MOCVD), atomic layer chemical vapor deposition (ALCVD), and oxidation of metals, among other known types of deposition.

As previously mentioned, materials having a dielectric constant greater than 4 that may be used for forming dielectric layer 302 other than hafnium oxide including hafnium silicate (e.g., $HfSi_xO_y$) and nitrided hafnium silicate (e.g., $HfSi_xO_yN_z$). Known types of deposition of a hafnium oxide, a hafnium silicate, a nitrided hafnium silicate, or a silicon oxynitride may include a form of chemical vapor deposition (CVD), including atomic layer deposition (ALD or ALCVD).

Gate electrodes 125 and 126 may be formed of the same or different materials. With respect to using the same materials, such electrodes 125 and 126 may be formed of silicided polysilicon, such as cobalt silicide (e.g., $CoSi_2$), nickel silicide (e.g., NiSi), or silicon germanium (e.g., SiGe). Notably, other known germanides may be used. Alternatively, different materials may be used to form gate electrodes 125 and 126. For example, for a transistor being a NMOS device as associated with gate electrode 126, material used to form gate electrode 126 may include tantalum, tantalum nitride (e.g., TaN), zirconium, hafnium, or a metal silicide (e.g., $MSi_x$; where the metal is zirconium or hafnium), a metal nitride (e.g., $MN_x$; where the metal is zirconium or hafnium), or a metal silicon nitride (e.g., $MSi_xN_y$; where the metal is zirconium or hafnium). Examples of materials that may be used for providing gate electrode 125 for storage element 102 include platinum, ruthenium, ruthenium iridium oxide (e.g., $RuO_2Ir$), nickel, cobalt, tungsten nitride (e.g., WN), or a metal silicide, metal nitride, or a metal silicon nitride, as previously mentioned with respect to gate electrode 126. Known types of deposition for forming either or both of gate electrodes 126 or 125 include various forms of CVD, as previously mentioned, and sputter deposition, among other known types of deposition. Moreover, gate dielectric deposition and gate electrode deposition tools may be clustered. Formation of gate electrodes is described in additional detail in a co-pending patent application entitled Workfunction-Adjusted Thyristor-Based Memory Device, by Kevin J. Yang, assigned application Ser. No. 11/187,777, filed Jul. 21, 2005, which is incorporated by reference herein in its entirety.

Figure 4A:
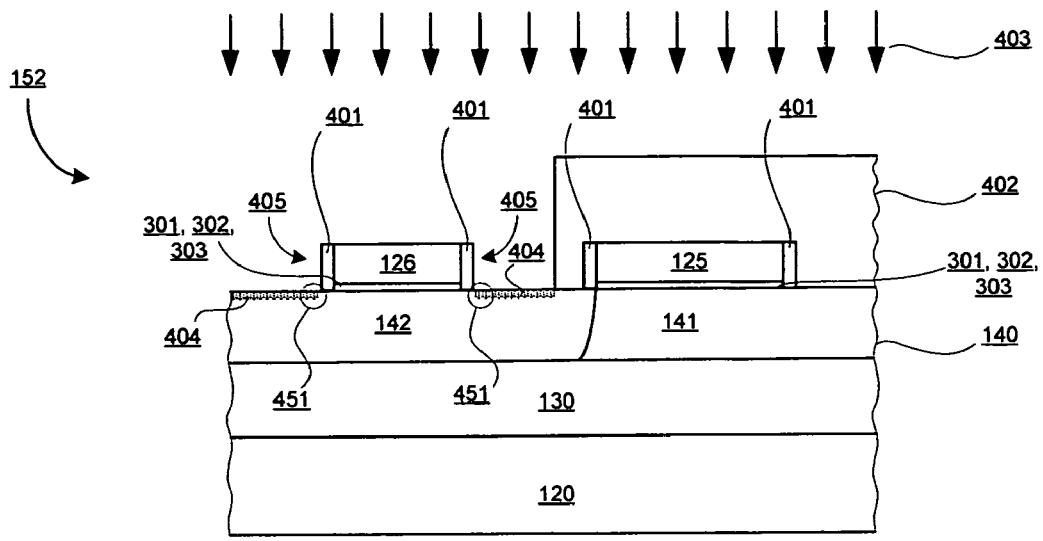
FIGS. 4A and 4B are respective cross-sectional views depicting an exemplary embodiment of an in-process thyristor-based memory cell, such as of FIG. 2B, after formation of gate dielectrics.
Figure 4B:
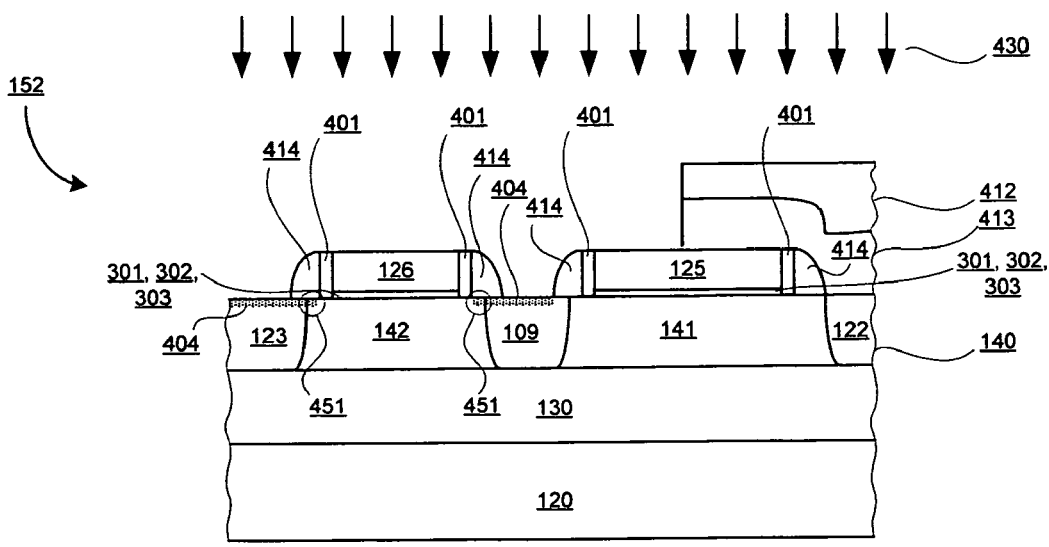

FIGS. 4A and 4B are respective cross-sectional views depicting an exemplary embodiment of an in-process thyristor-based memory cell 101, such as of FIG. 2B, after formation of gate dielectrics. Notably, gate dielectrics may be formed of one or more of layers 301, 302, and 303. For the exemplary embodiment of FIGS. 4A and 4B, an implementation of the second solution space is considered. In FIG. 4A, SOI wafer 152 has already had formation of isolation regions, implantation of wells, formation of gate dielectrics, formation of gate electrodes 125 and 126, and associated gate dielectric and gate electrode patterning. Gate dielectric layers 301, 302, and 303 may be etched at least in part during the etching to form gate electrodes 125 and 126.

A spacer material has been deposited, and an isotropic etch has been performed in order to form spacers 401. Examples of such spacer material are well known and include forms of silicon oxides. Notably, in contrast to the embodiment of FIG. 5B below, these "zero spacers" or offset spacers 401 are formed by deposition of one or more layers. Thus, spacers 401 extend to an upper surface of silicon layer 140, and generally dielectric layers, such as one or more of layers 301, 302, and 303, do not generally extend under spacers 401.

An implant 403 is provided to SOI wafer 152 after formation and patterning of a mask 402, such as from a resist, to protect storage element 102 of FIG. 1A. Implant 403 is a shallow implant used to form extension regions. For this example, it should be understood that implant 403 may be an n-type dopant, such as arsenic, implanted at an angle of approximately 0 to 7 degrees from vertical to an upper surface of SOI wafer 152 at a conventional implant energy and dosage. Though shallow implant 403 may implant into exposed gate electrode 126, for example, implant 403 is to form shallow implant regions 404 in exposed silicon layer 140. Shallow implant regions 404 are used to provide extension regions, such as extension regions 451 at least in part responsive to sidewalls 405 of offset spacers 401. Notably, because spacers 401 are in place prior to and during implant 403, extension regions 451 are effectively disposed away from sidewalls of gate electrode 126. In other words, extension regions 451 formed by shallow implant regions 404 are formed in part responsive to exposed sidewalls of spacers 401.

As is known with respect to extension regions, the further an extension region is away from an edge of a gate electrode, the greater the source/drain resistance, sometimes referred to as the "series resistance," of the transistor, such as the transistor formed in part using gate electrode 126. An increase of series resistance means that additional drive current may be needed to operate such a transistor. Thus, extension regions conventionally are not far removed from an edge of a gate electrode in order to reach a target drive current. However, as is known, gate-to-drain capacitance, sometimes referred to as "overlap capacitance," generally caused by an extension region extending under a gate electrode, increases the further such extension region extends under such gate electrode. An increase in overlap capacitance can slow operation of a transistor. Thus, conventionally there is a balance between series resistance and overlap capacitance in order to obtain a target operational speed.

In this example, series resistance may be increased to increase charge retention time. The extension region associated with the right side of gate electrode 126 is effectively pulled away from such gate electrode responsive to the presence of an offset spacer 401 on that side. Offset spacer 401 is greater in horizontal thickness than a conventional zero spacer, in that it is at least 10 nanometers ("nm") wide. By pulling extension region 451 away from gate electrode 126, responsive to offset spacer 401, a preferential charge leakage path 201 from base region 141 is made less preferential with respect to charge leakage. In other words, there is less charge leakage from base region 141 via an extension region 451 in proximity thereto by electrons going across a gate dielectric associated with gate electrode 126, as such extension region 451 is further from gate electrode 126. Accordingly, the leakage current via charge leakage path 201 is reduced, and thus data retention time of a thyristor-based memory cell 101 may be increased.

Furthermore, there is less gate overlap between gate electrode 126 and extension region 451. More particularly, subsequent thermal cycling of SOI wafer 152 due to subsequent processing may cause shallow implant region 404 to laterally defuse. By having offset spacer 401, the overlap between extension region 451 and gate electrode 126 is reduced. By reducing the overlap, the leakage current via charge leakage path 201 is reduced, again charge leakage via path charge leakage path 201 is made less preferential. Accordingly, data retention time of a thyristor-based memory cell 101 may be increased.

With reference to FIG. 4B, after deposition of a spacer material, such as a dielectric, including a silicon oxide, silicon nitride, or a combination thereof, an isotropic etch is done to form spacers 414 along sidewalls of offset spacers 401. Notable, for use of a silicon nitride material for forming spacers 414, a thin oxide layer may be formed, such as by deposition, along an exposed upper surface of silicon layer 140 prior to forming spacers 414 but after the formation of shallow implant regions ("shallow extension regions") 404. Moreover, implants forming regions 122 and 121 of FIG. 1B may be done. Additionally, one or more dielectric layers may be conformally deposited, masked with a pattern mask, and etched to form dielectric layer 413. Dielectric layer 413 may be used to cover a portion of gate electrode 125 and regions 122 to block slicidation of such portion of gate electrode 125 and regions 122 during subsequent processing. Additionally, a resist may be deposited and patterned to form resist layer 412 to protect regions 121 of FIG. 1B from implant 430.

Though implant 430 may implant into other areas, such as gate electrode 126 and a portion of gate electrode 125, implant 430 is to form source/drain type regions for cathode region 109 and access region 123. In an embodiment, these may be n+ regions formed using an n-type dopant, such as arsenic or phosphorus, implanted at an angle of approximately 0 to 7 degrees from vertical to a surface of silicon layer 140. Regions 109 and 123 may extend to BOx layer 130.

Notably, implant 430 is responsive to spacers 414 with respect to implantation into silicon layer 140, though some lateral implantation or diffusion may result such that regions 109 and 123 partially extend under one or more spacers 414.

As spacers 414 are aligned to sidewalls of offset spacers 401, implant regions 109 and 123 are pulled back further away from gate electrode 126 and an unmasked portion of gate electrode 125. Considering shallow implant region 404 as an extension of cathode region 109, namely where the combination is effectively a cathode node 109, there is less opportunity for charge leakage from cathode node 109 to tunnel through gate dielectric 302 as associated with gate electrode 126. Thus, the probability of leakage current via charge leakage path 201 is reduced. Accordingly, data retention time of a thyristor-based memory cell 101 may be increased.

Figure 5A:
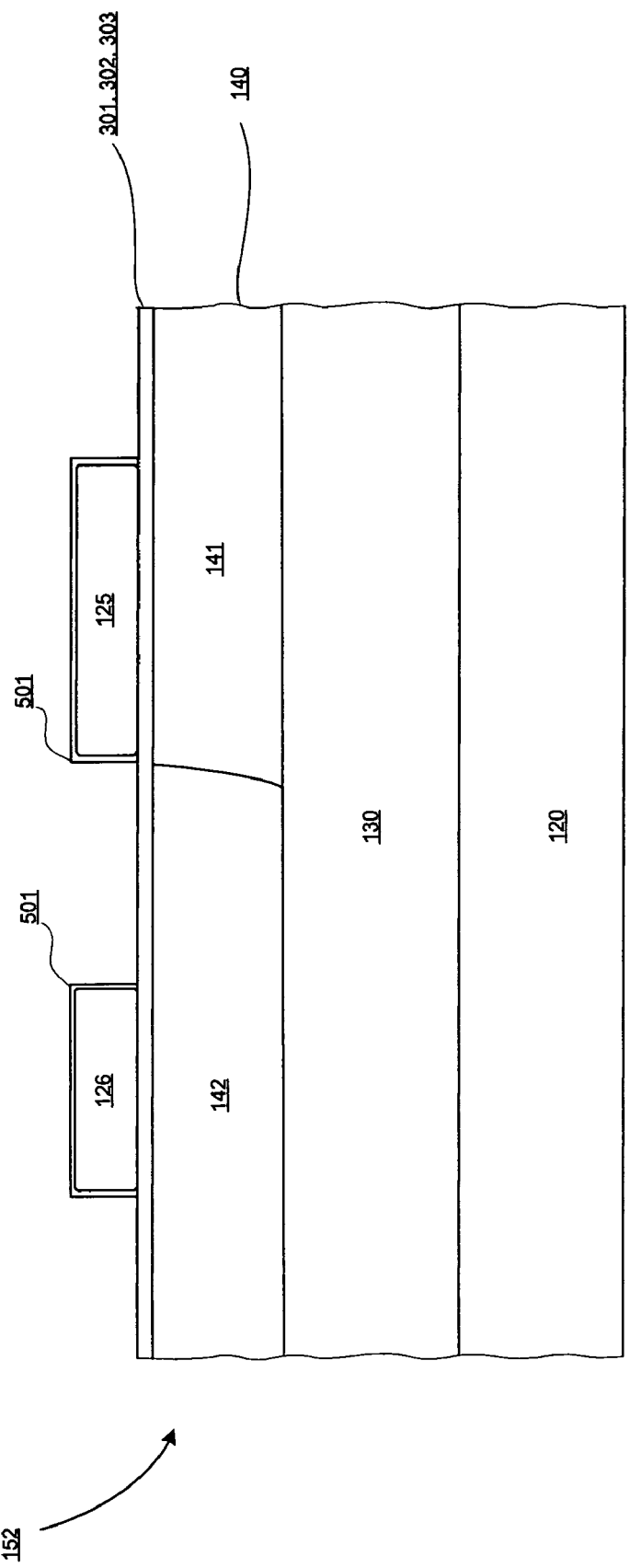
FIG. 5A is the cross-sectional view of FIG. 3, though after thermal oxidation of exposed surfaces of polysilicon gate electrodes to form a silicon oxide layer.

For an implementation of the third solution space, FIG. 5A is a cross-sectional view of FIG. 3 though after thermal oxidation of exposed surfaces of polysilicon gate electrodes 125 and 126 to form a silicon oxide layer 501. Notably, thermal oxidation of polysilicon gate electrodes 125 and 126 causes rounding, and thus undercutting of corners of such gate electrodes. This is more clearly seen in FIG. 5B, where there is shown the cross-sectional view of FIG. 5A after removal of an upper portion of silicon oxide layer 501. Notably, regions 502 are undercut regions. Undercut regions 502 undercut gate electrode 126 in proximity to the location of extension regions 451 of FIG. 4B.

The remainder of SOI wafer may be processed as previously described with reference to FIGS. 4A and 4B. For example, FIG. 5C is a cross-sectional view depicting the exemplary embodiment as illustratively shown in FIG. 4B, though with rounded corners of gate electrodes 125 and 126. It should be appreciated that by rounding corners of gate electrodes 125 and 126 to create undercut regions 502 of FIG. 5B, formation of offset spacers 401 laterally extends under gate electrodes 125 and 126. This lateral extension or "bird's beak" creates a greater dielectric separation between gate electrodes 125 and 126 with respect to active silicon of silicon layer 140 and a bottom surface of such gate electrodes. In other words, there is a relatively thicker dielectric barrier with respect to charge leakage at the bottom corners of gate electrodes 125 and 126 than if those corners were not rounded by local oxidation thereof. Notably, sidewall portions of silicon oxide layer 501 are illustratively shown as being merged with offset spacer 401. However, if materials deposited to form offset spacer 401 and silicon oxide layer 501 portions along sidewalls of gates 125 and 126 are dissimilar, such spacer layers may be distinctive.

Figure 5B:
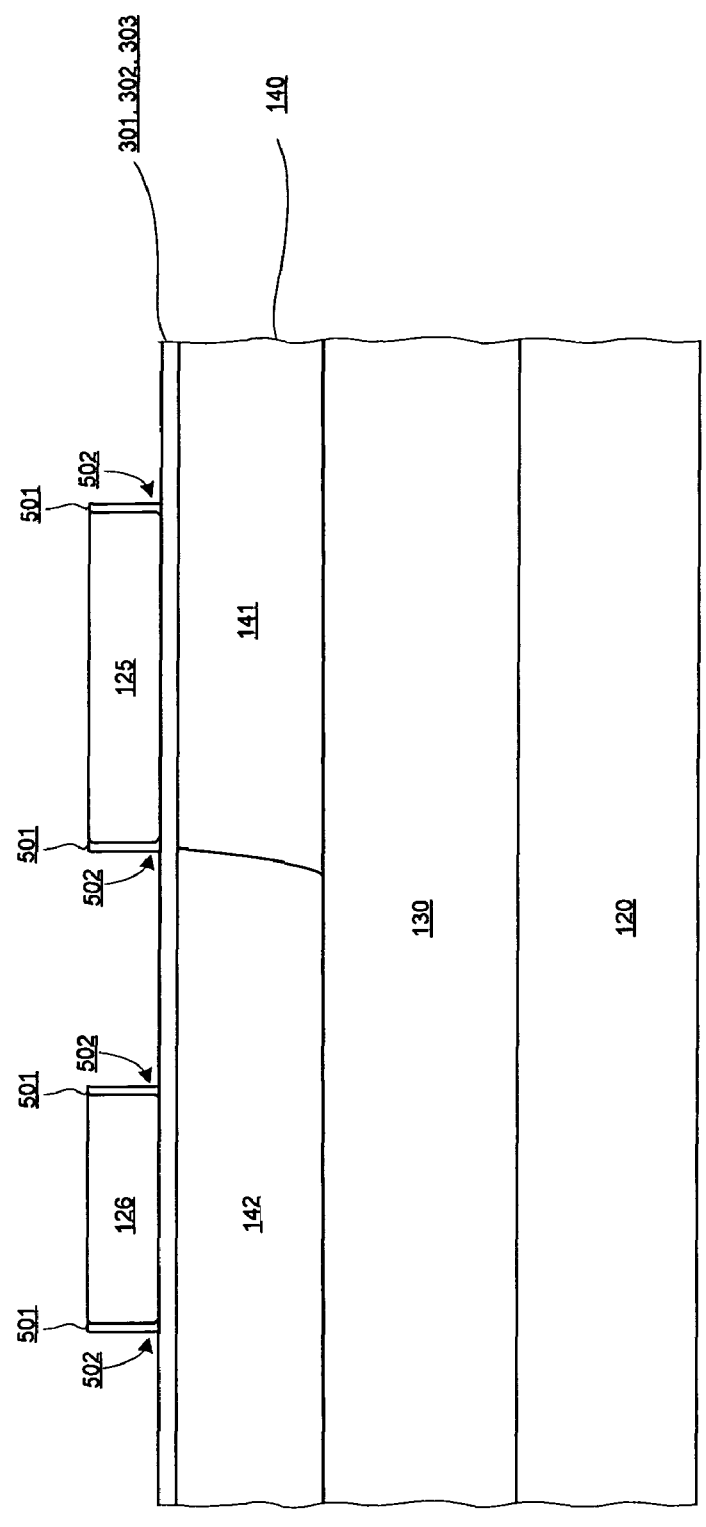
FIG. 5B is the cross-sectional view of FIG. 5A with only an upper portion of the silicon oxide layer removed from an upper surface of the gate electrodes.
Figure 5C:
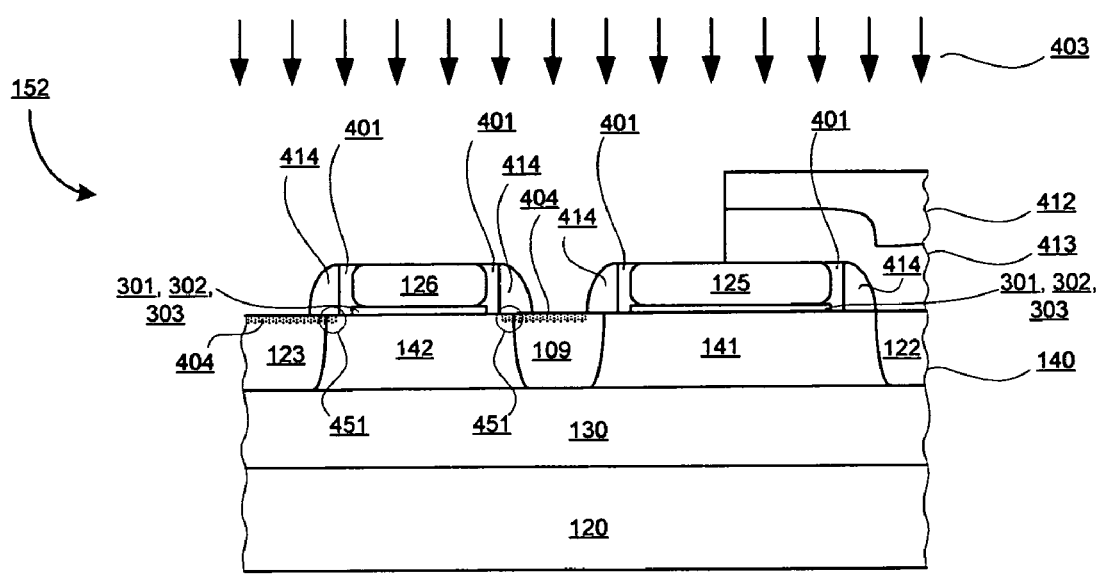
FIG. 5C is a cross-sectional view depicting the exemplary embodiment as illustratively shown in FIG. 4B, though with rounded corners of the gate electrodes.

Accordingly, charge stored in base region 141 has a larger dielectric boundary from what was the preferential leakage path owing to providing an undercut region 502 of FIG. 5B. Thus, charge leakage may be reduced, and thus thyristor-based memory cell 101 may have a longer data retention time.

Figure 5D:
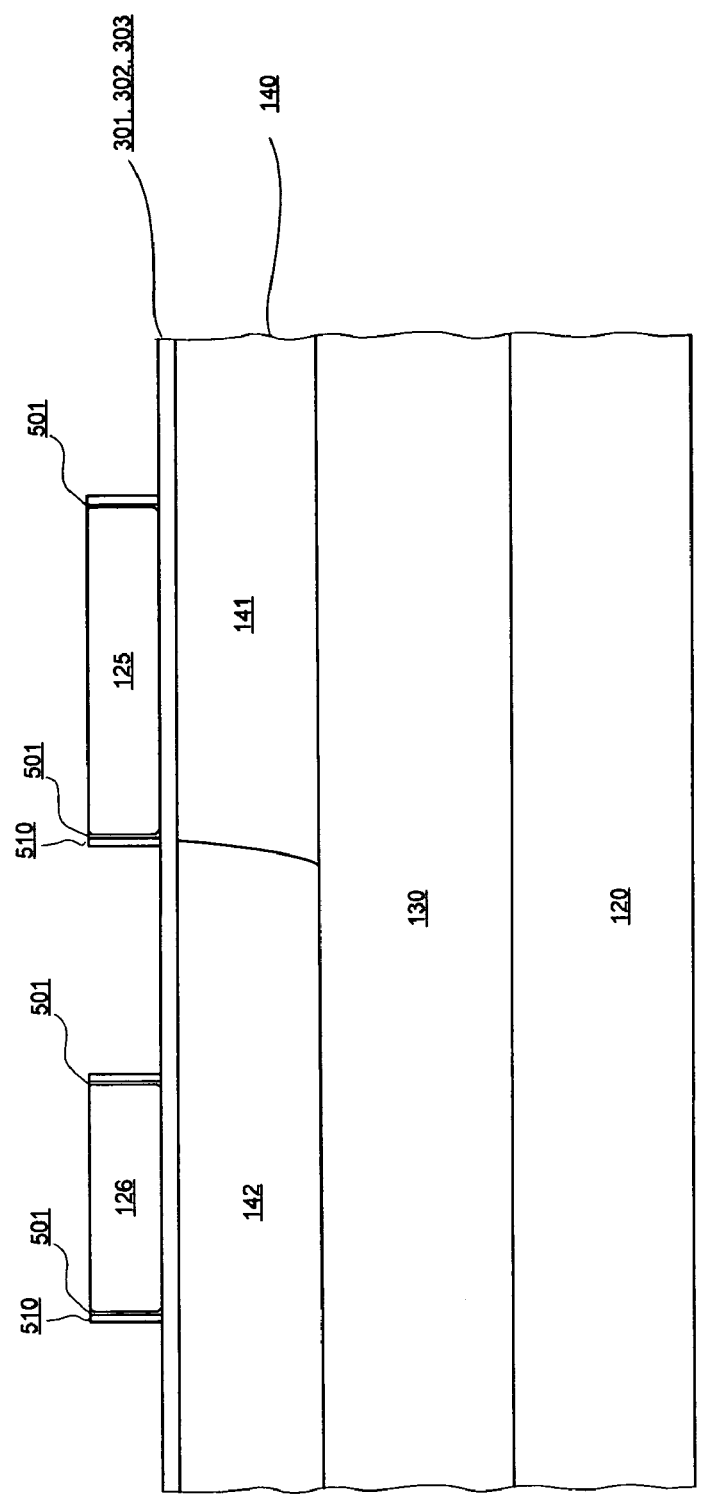
FIG. 5D is the cross-sectional view of 5B with a deposited spacer layer in addition to the silicon oxide layer remaining.

Alternatively, as illustratively shown in the cross-sectional view of FIG. 5D, an upper portion of silicon oxide layer 501 may be removed from an upper surface of gate electrodes 125 and 126 while leaving silicon oxide layer 501 at least under corners of gate electrodes 125 and 126. Such removal may be accomplished by a blanket etchback. Notably, such a blanket etchback (not shown) may be an anisotropic etch approximately perpendicular to the surface of silicon layer 140. Thus, silicon oxide layer 501 may be substantially left in place along sidewalls of gate electrodes 125 and 126 and under corners thereof. Alternatively, oxidation of polysilicon electrodes 125 and 126, or "reoxidation," may be done after patterning associated gate dielectrics. Thickness of silicon oxide layer 501 may be approximately 100 or more nm thick and, more particularly, may be approximately 150 nm thick. Accordingly, to build up an offset spacer, a spacer material may be deposited and etched with a spacer etch to form offset spacer 510 next to silicon oxide layers 510 along sidewalls of gate electrodes 125 and 126. Thus, a thicker offset may be controllably formed prior to formation of offset spacer 401.

Alternatively or in combination, local silicon oxide thickening may be done using a precursor implant into the area targeted for thickening. Thus, for example, an angled implant under corners of gate electrode 126 (not shown) may be done to accelerate oxidation of a portion of active silicon layer 140 to cause locally thicker silicon oxide under such corners.

Figure 5E:
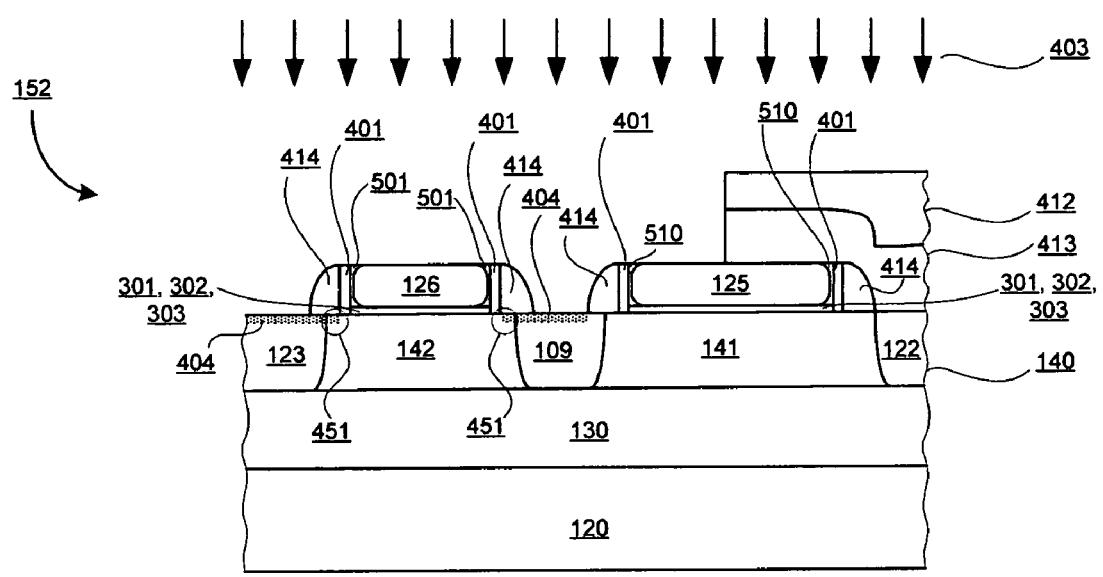
FIG. 5E is the cross-sectional view of the exemplary embodiment as illustratively shown in FIG. 5C, though having the silicon oxide layer used to form a portion of the offset spacers.

FIG. 5E is the cross-sectional view of the exemplary embodiment as illustratively shown in FIG. 5C, though having offset spacer 510 and silicon oxide layer 501 used to form a portion of offset spacing in addition to offset spacer 401. Notably, for purposes of clarity only offset spacer 510 and not silicon oxide layer 501 is illustratively shown where both materials have merged. However, the material used to form offset spacer 510 need not be the same type of material as silicon oxide layer 501. Moreover, the material used to form offset spacer 510 may be the same or different from the material used to form offset spacer 401. Materials previously described herein may be used for formation of spacer 510. Notably, gate electrodes 125 and 126 have rounded corners. Thus, silicon oxide layer 501 along at least the right sidewall of gate electrode 126 in FIG. 5D, together with offset spacers 510 and 401 along such right-side silicon oxide layer 501 of FIG. 5D, provide an offset for formation of extension region 451, at least along such right side in FIG. 5E, spaced away from a right side sidewall of gate electrode 126. Moreover, as silicon oxide layer 501 of FIG. 5D provides a dielectric barrier to tunneling current under at least a right side corner of gate electrode 126, charge leakage from extension region 451 to gate electrode 126 is inhibited.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. Claim(s) listing steps do not imply any order of the steps. Trademarks are the property of their respective owners.

What is claimed is:

1. A thyristor-based memory cell, comprising:
a thyristor-based storage element, the thyristor-based storage element having a first gate electrode formed over a first gate dielectric, the first gate electrode having a first sidewall, the first gate dielectric formed over a base region of the thyristor-based storage element, the base region located in a silicon layer;
a transistor coupled to the thyristor-based storage element via a cathode region, the cathode region located in the silicon layer, the transistor having a second gate electrode formed over a second gate dielectric, the second gate electrode having a second sidewall, the second gate dielectric formed over a body region of the transistor, the body region located in the silicon layer;
a spacer formed at least in part along the second sidewall of the second gate electrode facing the first sidewall of the first gate electrode;
a shallow implant region formed in the silicon layer responsive at least in part to the spacer, the spacer offsetting the shallow implant region from the second sidewall, a portion of the shallow implant region being for an extension region;
in addition to being the cathode region for the thyristor-based storage element, the cathode region being for a source/drain type region of the transistor, wherein the cathode region includes the source/drain type region and another portion of the shallow implant region, the source/drain type region not including the extension region; and the first gate dielectric and the second gate dielectric formed at least in part by deposition of a dielectric material, the spacer formation being performed separately from formation of the first gate dielectric and the second gate dielectric;

wherein a portion of the spacer is formed by oxidation of a portion of the second gate electrode along the second sidewall thereof;

wherein the spacer extends under the second gate electrode responsive to the oxidation of the portion of the second gate electrode along the second sidewall thereof;

wherein the spacer extends to an upper surface of the silicon layer;

wherein a dielectric constant of the dielectric material is in a range of approximately 4 to 10; and wherein a dielectric material is selected from an oxynitride and an aluminum oxide.

2. A thyristor-based memory cell, comprising:

a thyristor-based storage element, the thyristor-based storage element having a first gate electrode formed over a first gate dielectric, the first gate electrode having a first sidewall, the first gate dielectric formed over a base region of the thyristor-based storage element, the base region located in a silicon layer;

a transistor coupled to the thyristor-based storage element via a cathode region, the cathode region located in the silicon layer, the transistor having a second gate electrode formed over a second gate dielectric, the second gate electrode having a second sidewall, the second gate dielectric formed over a body region of the transistor, the body region located in the silicon layer;

a spacer formed at least in part along the second sidewall of the second gate electrode facing the first sidewall of the first gate electrode;

a shallow implant region formed in the silicon layer responsive at least in part to the spacer, the spacer offsetting the shallow implant region from the second sidewall, a portion of the shallow implant region being for an extension region;

in addition to being the cathode region for the thyristor-based storage element, the cathode region being for a source/drain type region of the transistor, wherein the cathode region includes the source/drain type region and another portion of the shallow implant region, the source/drain type region not including the extension region; and the first gate dielectric and the second gate dielectric formed at least in part by deposition of a dielectric material, the spacer formation being performed separately from formation of the first gate dielectric and the second gate dielectric;

wherein a portion of the spacer is formed by oxidation of a portion of the second gate electrode along the second sidewall thereof;

wherein the spacer extends under the second gate electrode responsive to the oxidation of the portion of the second gate electrode along the second sidewall thereof;

wherein the spacer extends to an upper surface of the silicon layer; and wherein a dielectric constant of the dielectric material is in a range of approximately 10 to 20.

3. The thyristor-based memory cell according to claim 2, wherein the dielectric material is a unary oxide.

4. The thyristor-based memory cell according to claim 3, wherein the unary oxide includes one of zirconium oxide, hafnium oxide, yttrium oxide, lanthanum oxide, gadolinium oxide, or scandium oxide.

5. The thyristor-based memory cell according to claim 2, wherein the dielectric material is a silicate.

6. The thyristor-based memory cell according to claim 5, wherein the silicate includes one of zirconium, hafnium, yttrium, or lanthanum.

7. A thyristor-based memory cell, comprising:

a thyristor-based storage element, the thyristor-based storage element having a first gate electrode formed over a first gate dielectric, the first gate electrode having a first sidewall, the first gate dielectric formed over a base region of the thyristor-based storage element, the base region located in a silicon layer;

a transistor coupled to the thyristor-based storage element via a cathode region, the cathode region located in the silicon layer, the transistor having a second gate electrode formed over a second gate dielectric, the second gate electrode having a second sidewall, the second gate dielectric formed over a body region of the transistor, the body region located in the silicon layer;

a spacer formed at least in part along the second sidewall of the second gate electrode facing the first sidewall of the first gate electrode;

a shallow implant region formed in the silicon layer responsive at least in part to the spacer, the spacer offsetting the shallow implant region from the second sidewall, a portion of the shallow implant region being for an extension region;

in addition to being the cathode region for the thyristor-based storage element, the cathode region being for a source/drain type region of the transistor, wherein the cathode region includes the source/drain type region and another portion of the shallow implant region, the source/drain type region not including the extension region; and the first gate dielectric and the second gate dielectric formed at least in part by deposition of a dielectric material, the spacer formation being performed separately from formation of the first gate dielectric and the second gate dielectric;

wherein a portion of the spacer is formed by oxidation of a portion of the second gate electrode along the second sidewall thereof;

wherein the spacer extends under the second gate electrode responsive to the oxidation of the portion of the second gate electrode along the second sidewall thereof;

wherein the spacer extends to an upper surface of the silicon layer; and wherein a dielectric constant of the dielectric material is greater than at least approximately 20.

8. The thyristor-based memory cell according to claim 7, wherein the dielectric material is an aluminate.

9. The thyristor-based memory cell according to claim 8, wherein the aluminate includes one of lanthanum or yttrium.

10. The thyristor-based memory cell according to claim 7, wherein the dielectric material is a single crystalline oxide.

* * * * *